(12) United States Patent
Lung

(10) Patent No.: US 7,919,766 B2
(45) Date of Patent: Apr. 5, 2011

(54) METHOD FOR MAKING SELF ALIGNING PILLAR MEMORY CELL DEVICE

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 489 days.

(21) Appl. No.: 11/876,179

(22) Filed: Oct. 22, 2007

(65) Prior Publication Data
US 2009/0101879 A1 Apr. 23, 2009

(51) Int. Cl.
*H01L 47/00* (2006.01)
(52) U.S. Cl. ............... 257/2; 257/4; 257/5; 257/E45.002
(58) Field of Classification Search .................. 257/4, 2, 257/3, 8, E45.002, 5; 247/5
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |

(Continued)

FOREIGN PATENT DOCUMENTS
WO 00/79539 12/2000
(Continued)

OTHER PUBLICATIONS

Atwood, G, et al., "90 nm Phase Change Technology with u Trench and Lance Cell Elements," VLSI Technology, Systems and Applications, Apr. 23-25, 2007, pp. 1-2.

(Continued)

*Primary Examiner* — Michael Trinh
(74) *Attorney, Agent, or Firm* — James F. Hann; Haynes Beffel & Wolfeld LLP

(57) ABSTRACT

A method for making a memory cell assembly includes forming a memory cell access layer over a substrate to create an access device with a bottom electrode. A memory material layer is formed over the memory cell access layer in electrical contact with the bottom electrode. A first electrically conductive layer is formed over the memory material layer. A first mask, extending in a first direction, is formed over the first electrically conductive layer and then trimmed so that those portions of the first electrically conductive layer and the memory material layer not covered by the first mask are removed.

14 Claims, 12 Drawing Sheets

U.S. PATENT DOCUMENTS

| | | | |
|---|---|---|---|
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,902,704 | A | 5/1999 | Schoenborn et al. |
| 5,920,788 | A | 7/1999 | Reinberg |
| 5,933,365 | A | 8/1999 | Klersy et al. |
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan et al. |
| 6,025,220 | A | 2/2000 | Sandhu |
| 6,031,287 | A | 2/2000 | Harshfield |
| 6,034,882 | A | 3/2000 | Johnson et al. |
| 6,046,951 | A | 4/2000 | El Hajji et al. |
| 6,066,870 | A | 5/2000 | Siek |
| 6,077,674 | A | 6/2000 | Schleifer et al. |
| 6,077,729 | A | 6/2000 | Harshfield |
| 6,087,269 | A | 7/2000 | Williams |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,291,137 | B1 | 9/2001 | Lyons et al. |
| 6,314,014 | B1 | 11/2001 | Lowrey et al. |
| 6,316,348 | B1 | 11/2001 | Fu et al. |
| 6,320,786 | B1 | 11/2001 | Chang et al. |
| 6,326,307 | B1 | 12/2001 | Lindley et al. |
| 6,337,266 | B1 | 1/2002 | Zahorik |
| 6,339,544 | B1 | 1/2002 | Chiang et al. |
| 6,351,406 | B1 | 2/2002 | Johnson et al. |
| 6,372,651 | B1 | 4/2002 | Yang et al. |
| 6,380,068 | B2 | 4/2002 | Jeng et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,440,837 | B1 | 8/2002 | Harshfield |
| 6,462,353 | B1 | 10/2002 | Gilgen |
| 6,483,736 | B2 | 11/2002 | Johnson et al. |
| 6,487,106 | B1 | 11/2002 | Kozicki |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,514,820 | B2 | 2/2003 | Ahn et al. |
| 6,534,781 | B2 | 3/2003 | Dennison |
| 6,545,903 | B1 | 4/2003 | Wu |
| 6,551,866 | B1 | 4/2003 | Maeda et al. |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,576,546 | B2 | 6/2003 | Gilbert et al. |
| 6,579,760 | B1 | 6/2003 | Lung et al. |
| 6,586,761 | B2 | 7/2003 | Lowrey |
| 6,589,714 | B2 | 7/2003 | Maimon et al. |
| 6,593,176 | B2 | 7/2003 | Dennison |
| 6,596,589 | B2 | 7/2003 | Tseng et al. |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,674,115 | B2 | 1/2004 | Hudgens et al. |
| 6,677,678 | B2 | 1/2004 | Biolsi et al. |
| 6,744,088 | B1 | 6/2004 | Dennison |
| 6,750,079 | B2 | 6/2004 | Lowrey et al. |
| 6,750,101 | B2 | 6/2004 | Lung et al. |
| 6,791,102 | B2 | 9/2004 | Johnson et al. |
| 6,797,979 | B2 | 9/2004 | Chiang et al. |
| 6,800,504 | B2 | 10/2004 | Li et al. |
| 6,800,563 | B2 | 10/2004 | Xu |
| 6,805,563 | B2 | 10/2004 | Ohashi et al. |
| 6,815,704 | B1 | 11/2004 | Chen |
| 6,830,952 | B2 | 12/2004 | Lung et al. |
| 6,838,692 | B1 | 1/2005 | Lung et al. |
| 6,850,432 | B2 | 2/2005 | Lu et al. |
| 6,859,389 | B2 | 2/2005 | Idehara et al. |
| 6,861,267 | B2 | 3/2005 | Xu et al. |
| 6,864,500 | B2 | 3/2005 | Gilton |
| 6,864,503 | B2 | 3/2005 | Lung et al. |
| 6,867,638 | B2 | 3/2005 | Saiki et al. |
| 6,881,603 | B2 | 4/2005 | Lai |
| 6,888,750 | B2 | 5/2005 | Walker et al. |
| 6,894,304 | B2 | 5/2005 | Moore |
| 6,894,305 | B2 | 5/2005 | Yi et al. |
| 6,900,517 | B2 | 5/2005 | Tanaka et al. |
| 6,903,362 | B2 | 6/2005 | Wyeth et al. |
| 6,909,107 | B2 | 6/2005 | Rodgers et al. |
| 6,910,907 | B2 | 6/2005 | Layadi et al. |
| 6,927,410 | B2 | 8/2005 | Chen |
| 6,928,022 | B2 | 8/2005 | Cho et al. |
| 6,933,516 | B2 | 8/2005 | Xu |
| 6,936,544 | B2 | 8/2005 | Huang et al. |
| 6,936,840 | B2 | 8/2005 | Sun et al. |
| 6,937,507 | B2 | 8/2005 | Chen |
| 6,940,109 | B2 | 9/2005 | Patel et al. |
| 6,943,365 | B2 | 9/2005 | Lowrey et al. |
| 6,969,866 | B1 | 11/2005 | Lowrey et al. |
| 6,972,428 | B2 | 12/2005 | Maimon |
| 6,972,430 | B2 | 12/2005 | Casagrande et al. |
| 6,977,181 | B1 | 12/2005 | Raberg et al. |
| 6,992,932 | B2 | 1/2006 | Cohen et al. |
| 7,023,009 | B2 | 4/2006 | Kostylev et al. |
| 7,033,856 | B2 | 4/2006 | Lung et al. |
| 7,038,230 | B2 | 5/2006 | Chen et al. |
| 7,038,938 | B2 | 5/2006 | Kang et al. |
| 7,042,001 | B2 | 5/2006 | Kim et al. |
| 7,054,183 | B2 | 5/2006 | Rinerson et al. |
| 7,067,837 | B2 | 6/2006 | Hwang et al. |
| 7,067,864 | B2 | 6/2006 | Nishida et al. |
| 7,067,865 | B2 | 6/2006 | Lung et al. |
| 7,078,273 | B2 | 7/2006 | Matsuoka et al. |
| 7,099,180 | B1 | 8/2006 | Dodge et al. |
| 7,115,927 | B2 | 10/2006 | Hideki et al. |
| 7,122,281 | B2 | 10/2006 | Pierrat |
| 7,122,824 | B2 | 10/2006 | Khouri et al. |
| 7,126,149 | B2 | 10/2006 | Iwasaki et al. |
| 7,132,675 | B2 | 11/2006 | Gilton |
| 7,151,273 | B2 | 12/2006 | Campbell et al. |
| 7,154,774 | B2 | 12/2006 | Bedeschi et al. |
| 7,158,411 | B2 | 1/2007 | Yeh et al. |
| 7,164,147 | B2 | 1/2007 | Lee et al. |
| 7,166,533 | B2 | 1/2007 | Happ |
| 7,169,635 | B2 | 1/2007 | Kozicki |
| 7,202,493 | B2 | 4/2007 | Lung et al. |
| 7,208,751 | B2 | 4/2007 | Ooishi et al. |
| 7,214,958 | B2 | 5/2007 | Happ |
| 7,220,983 | B2 | 5/2007 | Lung |
| 7,229,883 | B2 | 6/2007 | Wang et al. |
| 7,238,959 | B2 | 7/2007 | Chen |
| 7,238,994 | B2 | 7/2007 | Chen et al. |

| | | | | | | |
|---|---|---|---|---|---|---|
| 7,248,494 B2 | 7/2007 | Oh et al. | | 2006/0226409 A1 | 10/2006 | Burr et al. |
| 7,251,157 B2 | 7/2007 | Osada et al. | | 2006/0234138 A1 | 10/2006 | Fehlhaber et al. |
| 7,253,429 B2 | 8/2007 | Klersy et al. | | 2006/0237756 A1 | 10/2006 | Park et al. |
| 7,254,059 B2 | 8/2007 | Li et al. | | 2006/0245236 A1 | 11/2006 | Zaidi |
| 7,269,052 B2 | 9/2007 | Segal et al. | | 2006/0250885 A1 | 11/2006 | Cho et al. |
| 7,277,317 B2 | 10/2007 | Le Phan et al. | | 2006/0261392 A1 | 11/2006 | Lee et al. |
| 7,291,556 B2 | 11/2007 | Choi et al. | | 2006/0266993 A1 | 11/2006 | Suh et al. |
| 7,309,630 B2 | 12/2007 | Fan et al. | | 2006/0284157 A1 | 12/2006 | Chen et al. |
| 7,321,130 B2 | 1/2008 | Lung et al. | | 2006/0284158 A1 | 12/2006 | Lung et al. |
| 7,323,708 B2 | 1/2008 | Lee et al. | | 2006/0284214 A1 | 12/2006 | Chen |
| 7,332,370 B2 | 2/2008 | Chang et al. | | 2006/0284279 A1 | 12/2006 | Lung et al. |
| 7,336,526 B2 | 2/2008 | Osada et al. | | 2006/0286709 A1 | 12/2006 | Lung et al. |
| 7,351,648 B2 | 4/2008 | Furukawa et al. | | 2006/0286743 A1 | 12/2006 | Lung et al. |
| 7,359,231 B2 | 4/2008 | Venkataraman et al. | | 2006/0289848 A1 | 12/2006 | Dennison |
| 7,364,935 B2 | 4/2008 | Lung et al. | | 2007/0008786 A1 | 1/2007 | Scheuerlein |
| 7,365,385 B2 | 4/2008 | Abbott | | 2007/0030721 A1 | 2/2007 | Segal et al. |
| 7,379,328 B2 | 5/2008 | Osada et al. | | 2007/0037101 A1 | 2/2007 | Morioka |
| 7,385,235 B2 | 6/2008 | Lung et al. | | 2007/0045606 A1 | 3/2007 | Magistretti et al. |
| 7,394,088 B2 | 7/2008 | Lung | | 2007/0096162 A1 | 5/2007 | Happ et al. |
| 7,397,060 B2 | 7/2008 | Lung | | 2007/0096248 A1 | 5/2007 | Philipp et al. |
| 7,423,300 B2 | 9/2008 | Lung et al. | | 2007/0108077 A1 | 5/2007 | Lung et al. |
| 7,426,134 B2 | 9/2008 | Happ et al. | | 2007/0108429 A1 | 5/2007 | Lung |
| 7,440,308 B2 | 10/2008 | Jeong et al. | | 2007/0108430 A1 | 5/2007 | Lung |
| 7,449,710 B2 | 11/2008 | Lung | | 2007/0108431 A1 | 5/2007 | Chen et al. |
| 7,473,576 B2 | 1/2009 | Lung | | 2007/0109836 A1 | 5/2007 | Lung |
| 7,479,649 B2 | 1/2009 | Lung | | 2007/0109843 A1 | 5/2007 | Lung et al. |
| 7,507,986 B2 | 3/2009 | Lung | | 2007/0111429 A1 | 5/2007 | Lung |
| 7,514,334 B2 | 4/2009 | Chen et al. | | 2007/0115794 A1 | 5/2007 | Lung |
| 7,515,461 B2 | 4/2009 | Happ et al. | | 2007/0117315 A1 | 5/2007 | Lai et al. |
| 2002/0070457 A1 | 6/2002 | Sun et al. | | 2007/0120104 A1 | 5/2007 | Ahn et al. |
| 2002/0113273 A1 | 8/2002 | Hwang et al. | | 2007/0121363 A1 | 5/2007 | Lung |
| 2003/0072195 A1 | 4/2003 | Mikolajick | | 2007/0121374 A1 | 5/2007 | Lung et al. |
| 2003/0095426 A1 | 5/2003 | Hush et al. | | 2007/0126040 A1 | 6/2007 | Lung |
| 2003/0186481 A1 | 10/2003 | Lung | | 2007/0131922 A1 | 6/2007 | Lung |
| 2004/0026686 A1 | 2/2004 | Lung | | 2007/0131980 A1 | 6/2007 | Lung |
| 2004/0051094 A1* | 3/2004 | Ooishi ........................... 257/5 | | 2007/0138458 A1 | 6/2007 | Lung |
| 2004/0113137 A1 | 6/2004 | Lowrey | | 2007/0147105 A1 | 6/2007 | Lung et al. |
| 2004/0165422 A1 | 8/2004 | Hideki et al. | | 2007/0153563 A1 | 7/2007 | Nirschl |
| 2004/0248339 A1 | 12/2004 | Lung | | 2007/0154847 A1 | 7/2007 | Chen et al. |
| 2004/0256610 A1 | 12/2004 | Lung | | 2007/0155172 A1 | 7/2007 | Lai et al. |
| 2005/0018526 A1 | 1/2005 | Lee | | 2007/0156949 A1 | 7/2007 | Rudelic et al. |
| 2005/0029502 A1 | 2/2005 | Hudgens | | 2007/0158632 A1 | 7/2007 | Ho |
| 2005/0052904 A1 | 3/2005 | Cho et al. | | 2007/0158633 A1 | 7/2007 | Lai et al. |
| 2005/0062087 A1 | 3/2005 | Chen et al. | | 2007/0158645 A1 | 7/2007 | Lung |
| 2005/0093022 A1 | 5/2005 | Lung | | 2007/0158690 A1 | 7/2007 | Ho et al. |
| 2005/0127349 A1 | 6/2005 | Horak et al. | | 2007/0158862 A1 | 7/2007 | Lung |
| 2005/0145984 A1 | 7/2005 | Chen et al. | | 2007/0161186 A1 | 7/2007 | Ho |
| 2005/0167656 A1 | 8/2005 | Sun et al. | | 2007/0170881 A1 | 7/2007 | Noh et al. |
| 2005/0191804 A1 | 9/2005 | Lai et al. | | 2007/0173019 A1 | 7/2007 | Ho et al. |
| 2005/0201182 A1 | 9/2005 | Osada et al. | | 2007/0173063 A1 | 7/2007 | Lung |
| 2005/0212024 A1 | 9/2005 | Happ | | 2007/0176261 A1 | 8/2007 | Lung |
| 2005/0212026 A1 | 9/2005 | Chung et al. | | 2007/0187664 A1 | 8/2007 | Happ |
| 2005/0215009 A1 | 9/2005 | Cho | | 2007/0201267 A1 | 8/2007 | Happ et al. |
| 2005/0263829 A1 | 12/2005 | Song et al. | | 2007/0215852 A1 | 9/2007 | Lung |
| 2006/0006472 A1 | 1/2006 | Jiang | | 2007/0224726 A1 | 9/2007 | Chen et al. |
| 2006/0038221 A1 | 2/2006 | Lee et al. | | 2007/0235811 A1 | 10/2007 | Furukawa et al. |
| 2006/0066156 A1 | 3/2006 | Dong et al. | | 2007/0236989 A1 | 10/2007 | Lung |
| 2006/0073642 A1 | 4/2006 | Yeh et al. | | 2007/0246699 A1 | 10/2007 | Lung |
| 2006/0091476 A1 | 5/2006 | Pinnow et al. | | 2007/0249090 A1 | 10/2007 | Philipp et al. |
| 2006/0094154 A1 | 5/2006 | Lung | | 2007/0257300 A1 | 11/2007 | Ho et al. |
| 2006/0108667 A1 | 5/2006 | Lung | | 2007/0262388 A1 | 11/2007 | Ho et al. |
| 2006/0110878 A1 | 5/2006 | Lung et al. | | 2007/0267618 A1 | 11/2007 | Zaidi et al. |
| 2006/0110888 A1 | 5/2006 | Cho et al. | | 2007/0274121 A1 | 11/2007 | Lung et al. |
| 2006/0113520 A1 | 6/2006 | Yamamoto et al. | | 2007/0285960 A1 | 12/2007 | Lung et al. |
| 2006/0113521 A1 | 6/2006 | Lung | | 2007/0298535 A1 | 12/2007 | Lung |
| 2006/0118913 A1 | 6/2006 | Yi et al. | | 2008/0006811 A1 | 1/2008 | Philipp et al. |
| 2006/0124916 A1 | 6/2006 | Lung | | 2008/0012000 A1 | 1/2008 | Harshfield |
| 2006/0126395 A1 | 6/2006 | Chen et al. | | 2008/0014676 A1 | 1/2008 | Lung et al. |
| 2006/0131555 A1 | 6/2006 | Liu et al. | | 2008/0025089 A1 | 1/2008 | Scheuerlein et al. |
| 2006/0138467 A1 | 6/2006 | Lung | | 2008/0043520 A1 | 2/2008 | Chen |
| 2006/0154185 A1 | 7/2006 | Ho et al. | | 2008/0094871 A1 | 4/2008 | Parkinson |
| 2006/0157681 A1 | 7/2006 | Chen et al. | | 2008/0101110 A1 | 5/2008 | Happ et al. |
| 2006/0163554 A1 | 7/2006 | Lankhorst et al. | | 2008/0137400 A1 | 6/2008 | Chen et al. |
| 2006/0169968 A1* | 8/2006 | Happ ........................... 257/2 | | 2008/0164453 A1 | 7/2008 | Breitwisch et al. |
| 2006/0172067 A1 | 8/2006 | Ovshinsky et al. | | 2008/0165569 A1 | 7/2008 | Chen et al. |
| 2006/0175599 A1 | 8/2006 | Happ | | 2008/0165570 A1 | 7/2008 | Happ et al. |
| 2006/0198183 A1 | 9/2006 | Kawahara et al. | | 2008/0165572 A1 | 7/2008 | Lung |
| 2006/0205108 A1 | 9/2006 | Maimon et al. | | 2008/0166875 A1 | 7/2008 | Lung |
| 2006/0211165 A1 | 9/2006 | Hwang et al. | | 2008/0179582 A1 | 7/2008 | Burr et al. |

| | | |
|---|---|---|
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |

FOREIGN PATENT DOCUMENTS

| | | |
|---|---|---|
| WO | 01/45108 | 6/2001 |
| WO | 0225733 | 3/2002 |

OTHER PUBLICATIONS

Axon Technologies Corporation paper: Technology Description, published in 1997, pp. 1-6.
Gleixner, "Phase Change Memory Reliability", 22nd NVSMW, Aug. 26, 2007, 46 pages.
Yamada, Noboru, "Potential of Ge-Sb-Te phase-change optical disks for high-data-rate recording in the near future," (Conference Proceedings Paper), Jul. 30, 1997, vol. 3109, 10 pages.
Adler, David, "Amorphous-Semiconductor Devices," Sci. Amer., vol. 236, pp. 36-48, May 1977.
Adler, D. et al., "Threshold Switching in Chalgenid-Glass Thin Films," J. Appl/Phys 51(6), Jun. 1980, pp. 3289-3309.
Ahn, S.J. et al., "A Highly Manufacturable High Density Phase Change Memory og 64 Mb and Beyond," IEEE IEDM 2004, pp. 907-910.
Axon Technologies Corporation paper: Technology Description, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory,"AFIT/GE/ENG/00M-04, Mar. 2000 121 pages.
Chen, et al., "Non-Volatile Resistive Switching for Advanced Memory Applications," IEEE IEDM, Dec. 5-7, 2005, 4 pp.
Cho, S.L. et al., "Highly Scalable On-axis Confined Cell Structure for High Density PRAM beyond 256Mb," 2005 Symposium on VLSI Technology Digest of Technical Papers, pp. 96-97.
Gibson, G.A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y.H. et al., "An Edge Contact Type Cell from Phase Change RAM Featuring Very Low Power Consumtion," 2003 Symposium on VSLI Technology Digest of Technical Papers, pp. 175-176.
Happ, T.D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.
Horii, H. et al., "A Novel Cell Technology Using N-Doped GeSbTe Films for Phase Change RAM," 2003 Symposium on VLSI Technlogy Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y.N. et al., "Full Integration and Reliability Evaluation of Phase-Change RAM Based on 0.24 mm-CMOS Technologies," 2003 Symposium on VLSI Technology Digest of Technical Papers, pp. 173-174.
Iwasaki, Hiroko et al, "completely Erasable Phase Change Optical Disk," Jpn. J. Appl. Phys., Feb. 1992, pp. 461-465, vol. 31.
Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
"Magnetic Bit Boost," www.sciencenews.org <http://www.sciencenews.org>, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Non-volatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org <http://www.sciencenews.org>, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory <http://klabs.org/richcontent/MAPLDCon99/Papers/P21_Tyson_P.PDF#search=' nonvolatile%20high%20density%20high%20performance%20-phase%20change%20memory>', 8 pages.
Wolf, Stanley, Excerpt from: Silicon Processing for the VLSI Era-vol. 4, pp. 674-679, 2004.
Wicker, Guy, "A Comprehensive Model of Submicron Chalcogenide Switching Devices," Doctoral Dissertation, Wayne State University, Detroit, MI, 1996.
Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology 256Mb PRAM," VLSI Technology, Digest of Technical Papers, Jun. 14-16, 2005, pp. 98-99.

Chao, D-S. et al., "Low Programming Current Phase Change Memory Cell with gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boca Ration, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986D, IP.com Prior Art Database, Oct. 18, 2006, 4 pp.

* cited by examiner

METHOD FOR MAKING SELF ALIGNING PILLAR MEMORY CELL DEVICE

PARTIES TO A JOINT RESEARCH AGREEMENT

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example resistor random access memory (RRAM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same." One method for making stacked phase change memory devices uses crossing line patterns to create the stacks. See, for example, U.S. Pat. No. 6,579,760 issued Jun. 17, 2003, to Lung, "Self-Aligned, Programmable Phase Change Memory" and U.S. Pat. No. 6,940,109 issued Sep. 6, 2005, to Patel et al., "High-Density 3-D Rail Stack Arrays and Method of Making."

Accordingly, an opportunity arises to devise methods and structures that form memory cells with structures that have small active regions of programmable resistive material using reliable and repeatable manufacturing techniques.

BRIEF SUMMARY OF THE INVENTION

One example of a method for making a memory cell assembly is carried out as follows. A memory cell access layer is formed over a substrate to create an access device comprising a bottom electrode. A first memory subassembly is formed to extend over the memory cell access layer in a first direction. The first memory subassembly comprises a first electrically conductive material and a memory material. The memory material is in electrical contact with the bottom electrode. The first memory subassembly has a first height above the memory cell access layer. A first fill layer is formed over the memory cell access layer to create a second subassembly. The fill layer has a second height above the memory cell access layer. The first and second heights are generally equal. A top electrode is formed on the second subassembly. The top electrode extends in a second direction transverse to the first direction and crosses over and is in electrical contact with the first electrically conductive material. In some examples the first memory subassembly forming step may comprise the following. A memory material layer is formed over the memory cell access layer, the memory material layer being in electrical contact with the bottom electrode. A first electrically conductive layer is formed over the memory material layer. A first mask is formed over the first electrically conductive layer, the first mask extending in the first direction. The first mask is trimmed at least at a first position along the first mask. Those portions of the first electrically conductive layer and the memory material layer not covered by the first mask are removed. In some examples the first mask forming and first mask trimming steps may be carried out using a chosen mask forming process and a chosen mask trimming process. The chosen mask forming process has a minimum feature size so that the memory element has a second memory element dimension in the second direction. The second memory element dimension is smaller than the minimum feature size of the chosen mask forming process.

One example of a memory cell assembly comprises a memory cell access layer, a top contact layer and a memory cell layer therebetween. The memory cell access layer comprises a bottom contact. The top contact layer comprises a top contact. The memory cell layer comprises a pillar-like memory element having a cross-sectional area and first and second dimensions measured in first and second transverse directions. The memory element is electrically connected to the bottom and top contacts. The first and second dimensions are smaller than a minimum feature size for a process used to form the memory element.

Other features, aspects and advantages of the present invention can be seen on review the figures, the detailed description, and the claims which follow.

DETAILED DESCRIPTION OF THE INVENTION

Figure 1:
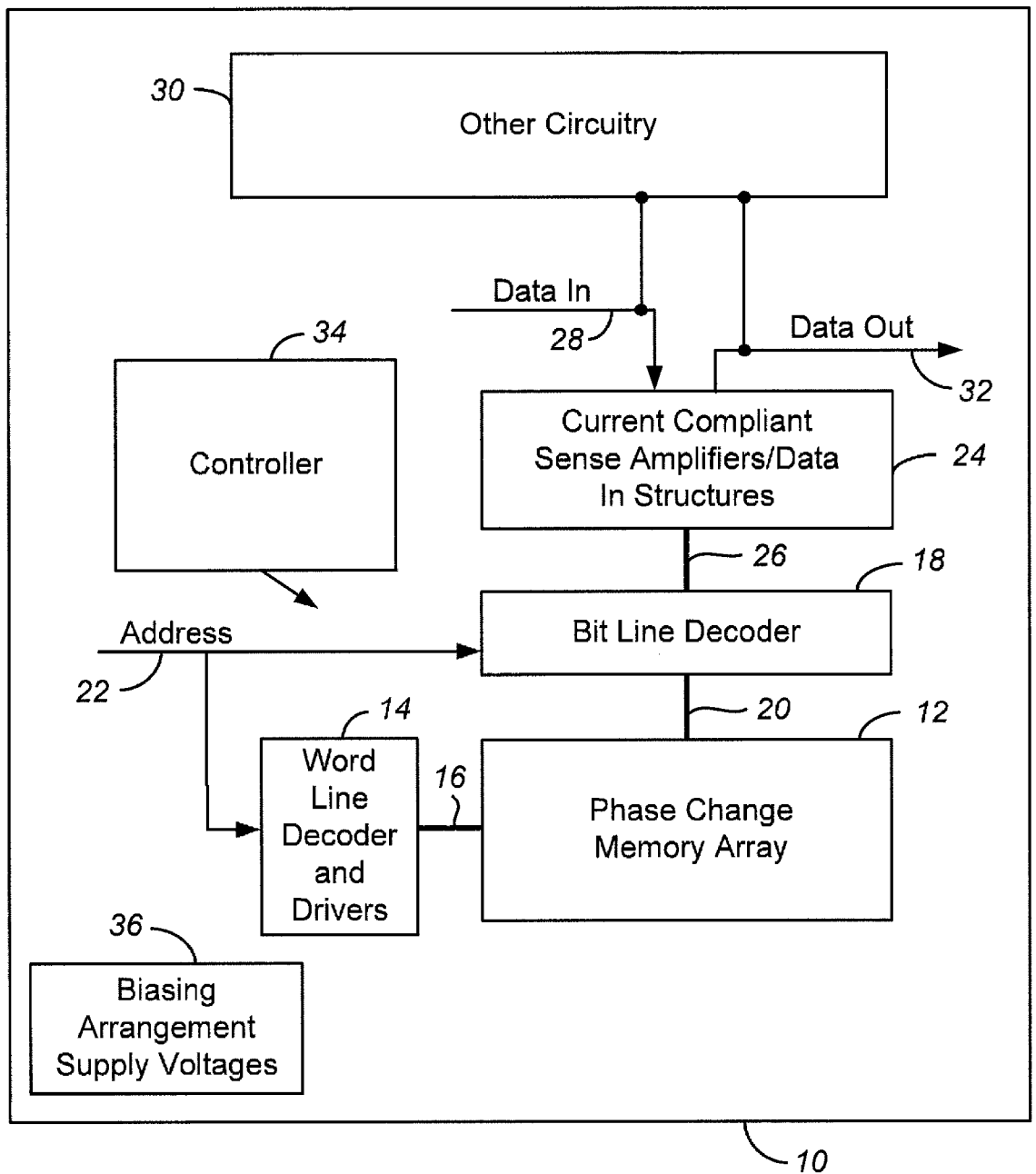
FIG. 1 is a block diagram of an integrated circuit device in accordance with the present invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

With regard to directional descriptions herein, the orientation of the drawings establish their respective frames of reference, with "up", "down", "left" and "right" referring to directions shown on the respective drawings. Similarly, "thickness" refers to a vertical dimension and "width" to the horizontal. These directions have no application to orientation of the circuits in operation or otherwise, as will be understood by those in the art.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
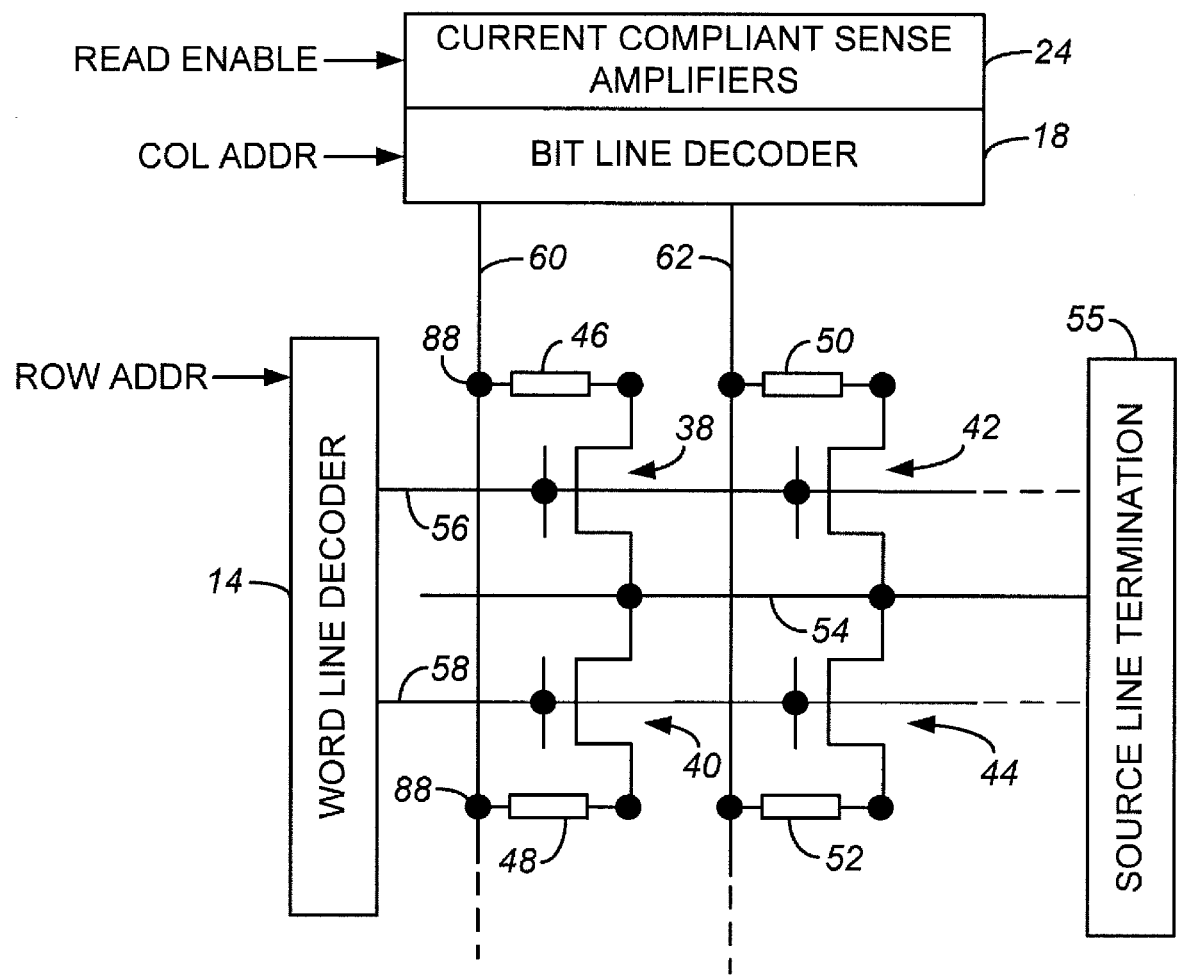
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality of word lines 16 including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality of bit lines 20 including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source.

Figure 3:
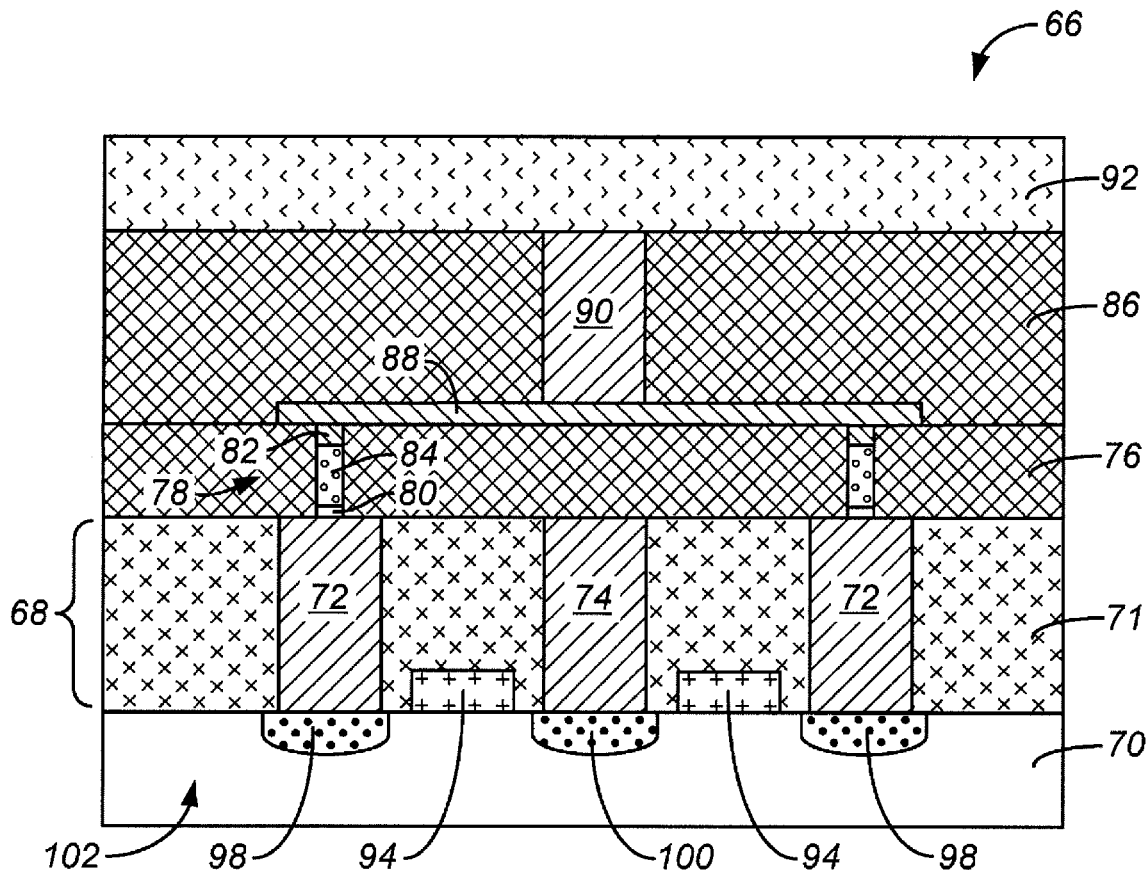
FIG. 3 is a simplified cross-sectional view of an example of a memory cell device in accordance with the present invention.

FIG. 3 illustrates one example of a memory cell device 66. Device 66 includes broadly a memory cell access layer 68 on a substrate 70. Layer 68 includes a dielectric layer 71 within which bottom electrode 72 and a common source line 74 are formed. Dielectric layer 71 is typically silicon dioxide or silicon nitride while bottom electrode 72 and common source line 74 are typically tungsten, although other appropriate materials may also be used. A first fill material layer 76 is formed over memory cell access layer 68 and includes a memory assembly 78 overlying and in contact with bottom electrode 72. Memory assembly 78 includes a bottom electrode contact enhancement element 80 contacting bottom electrode 72, a first electrode contact element 82 and a memory element 84 between in contact with elements 82 and 80. Memory element 84 is made of a programmable memory material that can change state by the application of energy. One example of such a programmable memory material is a phase change material such as GST, described in more detail below. Elements 80 and 82 are preferably electrically conductive materials that provide enhanced contact with memory element 84. When memory element 84 is made of GST, elements 82 and 84 may be made of, for example, titanium nitride. A second fill material layer 86, typically a dielectric such as silicon dioxide or silicon nitride or layers of silicon dioxide and silicon nitride, is formed over layer 76. Layer 86 includes a top electrode 88, contacting first electrode contact element 82, and a via 90. Top electrode 88 is typically an electrically conductive material such as titanium nitride while via is typically an electrically conductive material such as tungsten. A bit line 92 is formed over layer 86 and an electrical contact with via 90.

Memory cell device 66 also includes polysilicon word lines 94 within dielectric layer 71, drain regions 98 within substrate 70 and beneath bottom electrodes 72 and source region 100 within substrate 70 beneath common source line 74. A gate oxide region, not shown, is typically formed in substrate 70 adjacent to layer 68. In this example transistors act as the access devices 102. Other access devices, such as diodes, may also be used.

The dielectric materials of layers 71, 76 and 86 may comprise an electrical insulator including one or more elements selected from the group consisting of Si, Ti, Al, Ta, N, O, and C. In preferred devices, the dielectric materials have a low thermal conductivity, less than about 0.014 J/cm*K*sec. In other preferred embodiments, when memory element 84 is made from a phase change material, the thermally insulating dielectric material of first fill material layer 76 has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric material for layer 76 include $SiO_2$, SiCOH, polyimide, polyamide, and fluorocarbon polymers. Other examples of materials which are candidates for use for the thermally insulating dielectric materials include fluorinated $SiO_2$, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within the dielectric materials can provide thermal and electrical insulation.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell device 66 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 84 that changes phase is small; and accordingly, the magnitude of the reset current required for changing the phase is very small.

Embodiments of memory cell device 66 include phase change based memory materials, including chalcogenide based materials and other materials, for memory element 84. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material
   $Ge_xSb_yTe_z$
   x:y:z=2:2:5
   Or other compositions with x: 0~5; y: 0~5; z: 0~10
   GeSbTe with doping, such as N—, Si—, Ti—, or other element doping may also be used.
   Formation method: By PVD sputtering or magnetron-sputtering method with reactive gases of Ar, $N_2$, and/or He, etc chalcogenide@ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.
   The post deposition annealing treatment with vacuum or N2 ambient is sometimes needed to improve the crystallize state of chalcogenide material. The annealing temperature typically ranges 100 C to 400 C with an anneal time of less than 30 minutes.
   The thickness of chalcogenide material depends on the design of cell structure. In general, a chalcogenide material with thickness of higher than 8 nm can have a phase change characterization so that the material exhibits at least two stable resistance states.

2. CMR (colossal magneto resistance) material
   $Pr_xCa_yMnO_3$
   x:y=0.5:0.5
   Or other compositions with x: 0~1; y: 0~1
   Another CMR material that includes Mn oxide may be used
   Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.
   The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.
   The thickness of CMR material depends on the design of cell structure. The CMR thickness of 10 nm to 200 nm can be used to be the core material.
   A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-element compound
   $Ni_xO_y$; $Ti_xO_y$; $Al_xO_y$; $W_xO_y$; $Zn_xO_y$; $Zr_xO_y$; $Cu_xO_y$; etc
   x:y=0.5:0.5
   Other compositions with x: 0~1; y: 0~1
   Formation method:
   1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.
   The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.
   2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

An exemplary method for forming chalcogenide material uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Is preferred that all or part of the portions of elements 80, 82 contacting memory element 84 comprise an electrode material, such as TiN, or another conductor selected for compatibility with the phase change material of memory element 84. Other electrical contact enhancement materials such as TaAlN, WAlN or TiAlN may also be used. In the embodiment of FIG. 3, top electrode 88 and elements 80, 82 are all made of TiN while bottom electrode 72 comprises tungsten. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. TiN may be preferred because it makes good contact with GST (discussed above) as memory element 84, it is a common material used in semiconductor manufacturing, and it provides a good diffusion barrier at the higher temperatures at which GST transitions, typically in the 600-700° C. range.

Figure 4:
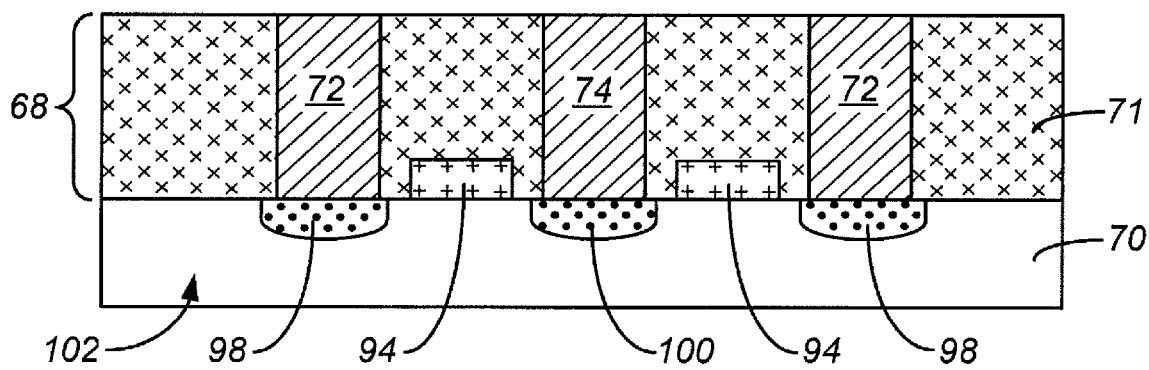
FIGS. 4-19 illustrate an example of steps followed in the manufacture of the memory cell device of FIG. 3.
Figure 5:
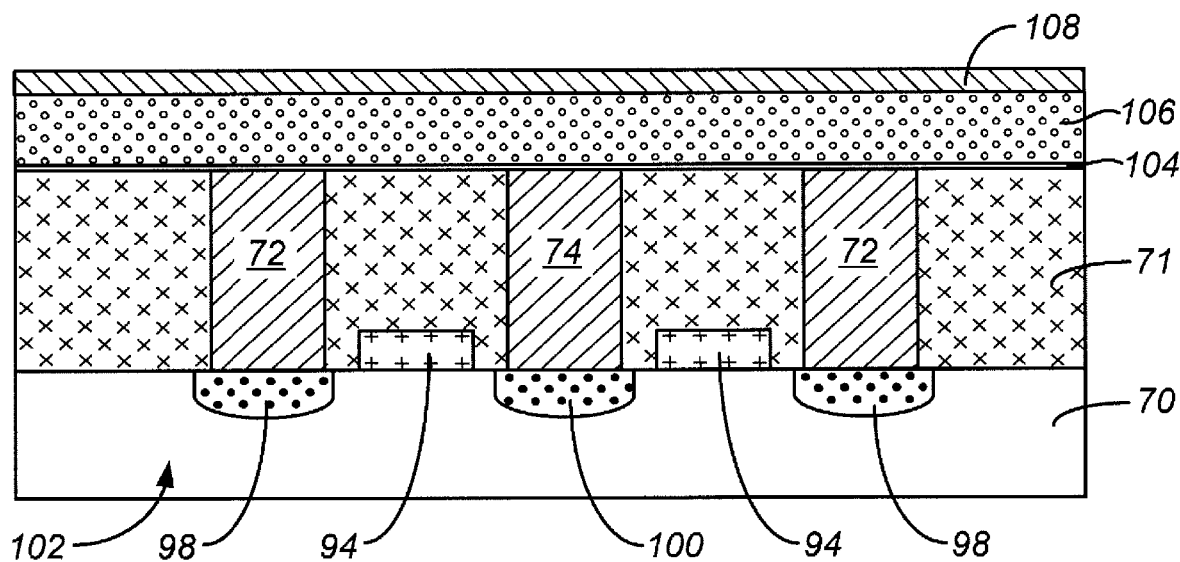

FIGS. 4-19 illustrate an example of a method used to manufacture memory cell device 66 of FIG. 3. A memory cell access layer 68 is formed over substrate 70 to create transistor type access devices 102 as shown in FIG. 4. FIG. 5 illustrates the result of depositing an electrode contact enhancement layer 104, from which element 80 is formed, over layer 68. This is followed by depositing a memory material layer 106, from which memory element 84 is formed, over layer 104. A first electrically conductive layer 108, from which first electrode contact element 82 is formed, is deposited on layer 106.

Figure 7:
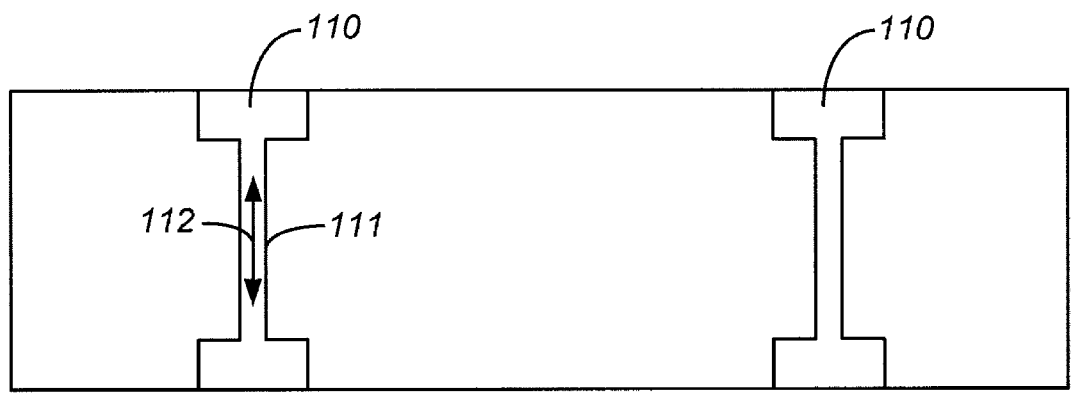
Figure 6:
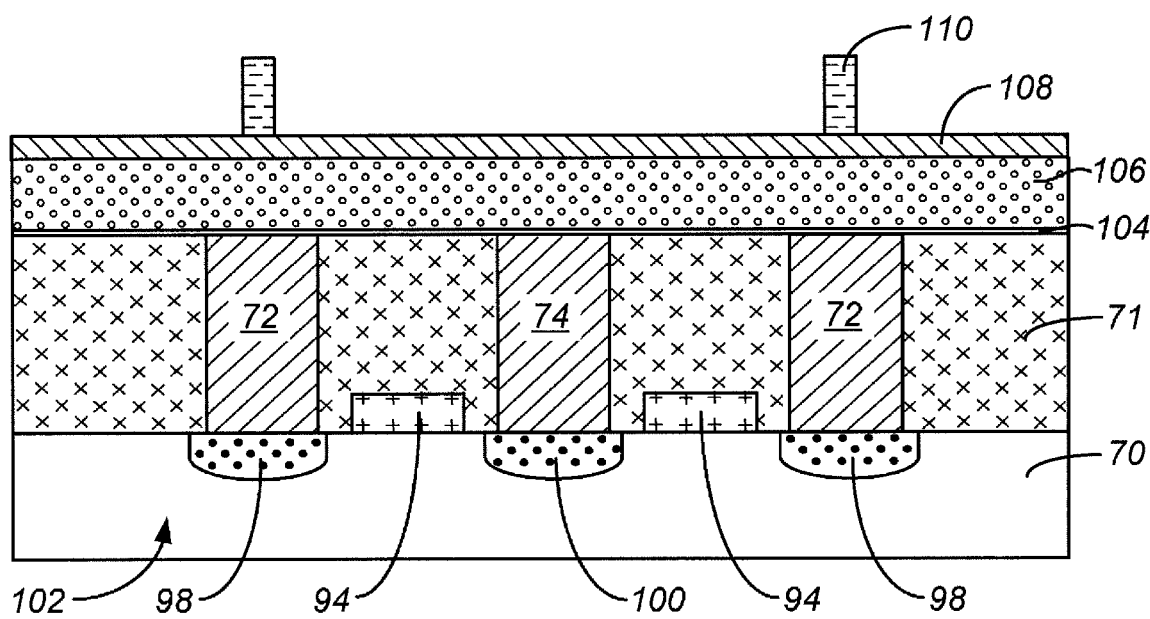
Figure 9:
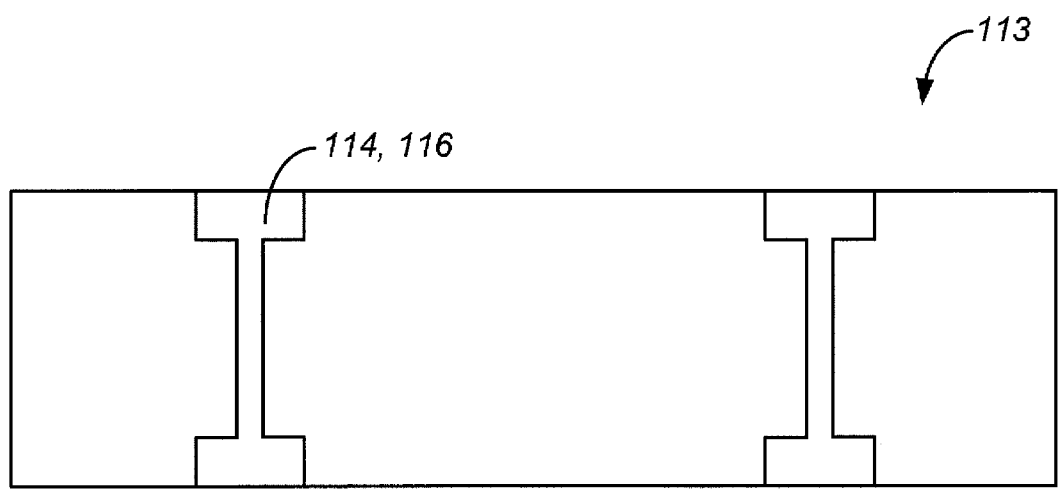
Figure 8:
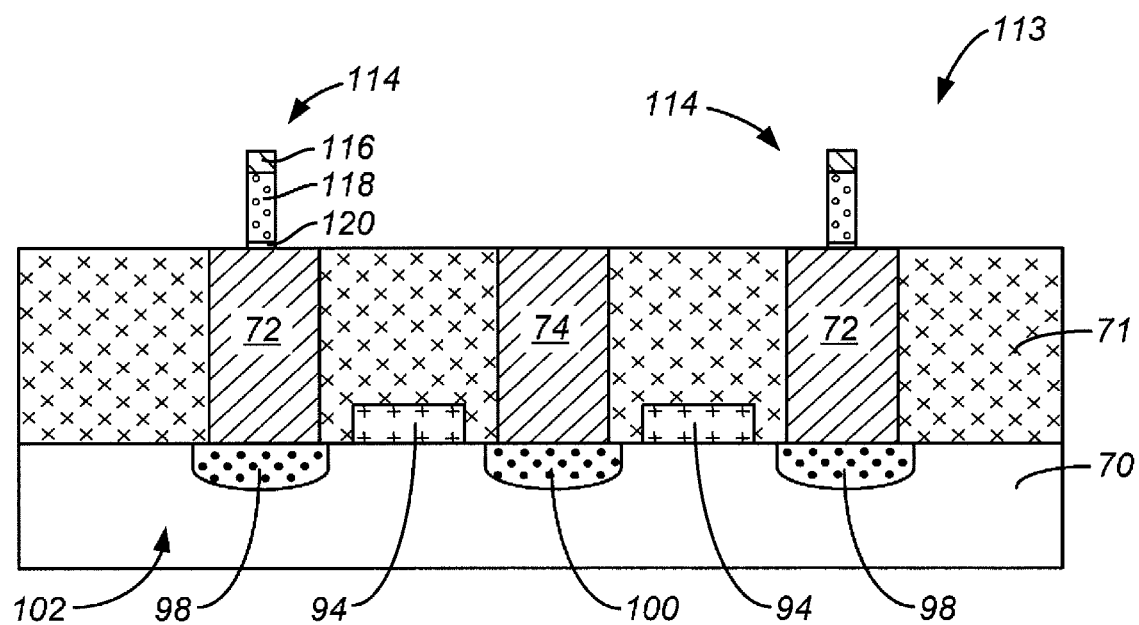

FIGS. 6 and 7 show the result of lithographically forming a first mask 110 over layer 108. First mask 110 is generally centered on bottom electrode 72 and extends in a first direction 112. The central portion 111 of first mask 110 is trimmed to have a sublithographic lateral dimension perpendicular to direction 112. Thereafter, as shown in FIGS. 8 and 9, an etching procedure is conducted to remove those portions of layers 108, 106 and 104 not covered by first mask 110, after which first mask 110 is removed leaving a first subassembly 113 including a memory assembly 114 above each bottom electrode 72. Each memory assembly 114 includes a first electrically conductive material portion 116, formed from layer 108, a memory material portion 118, formed from layer 106 and an electrode contact enhancement portion 120, formed from layer 104.

Figure 11:
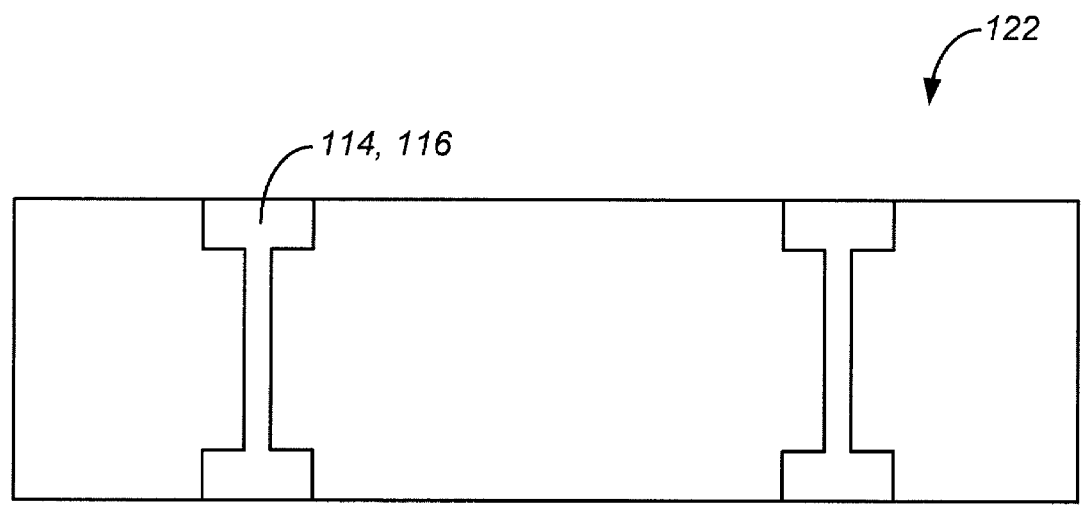
Figure 10:
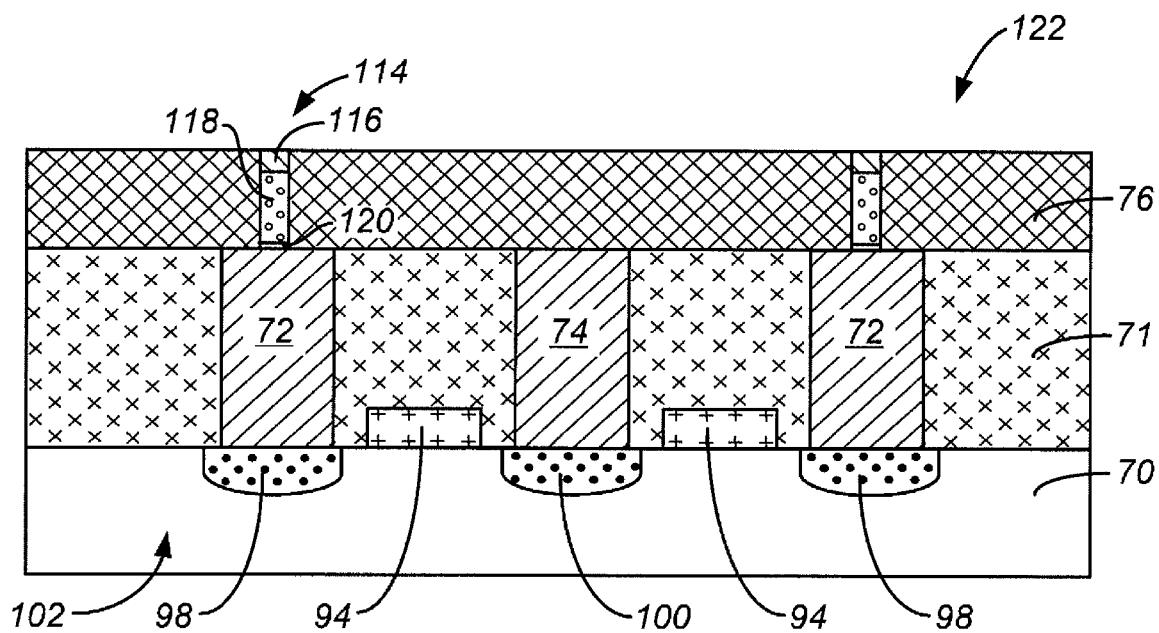
Figure 12:
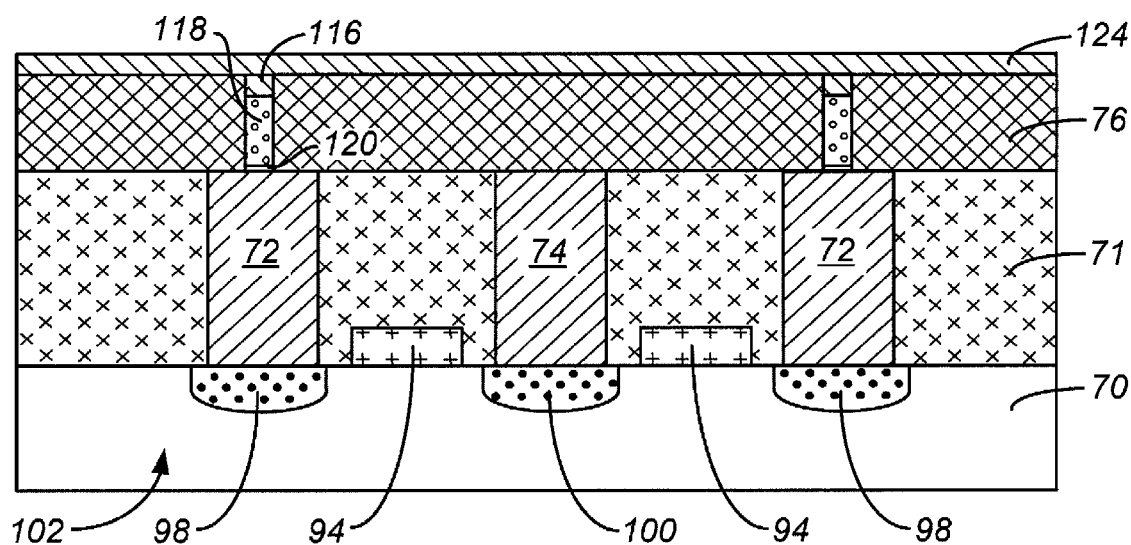
Figure 14:
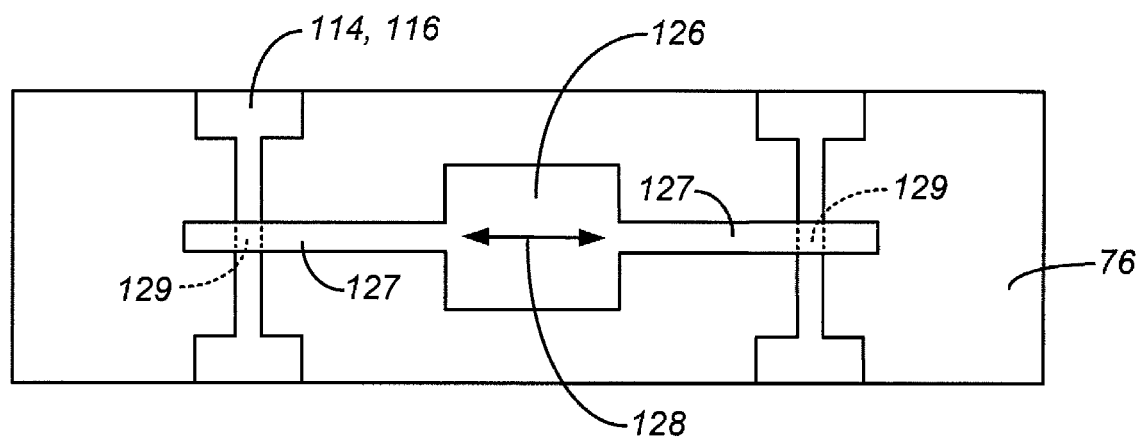
Figure 13:
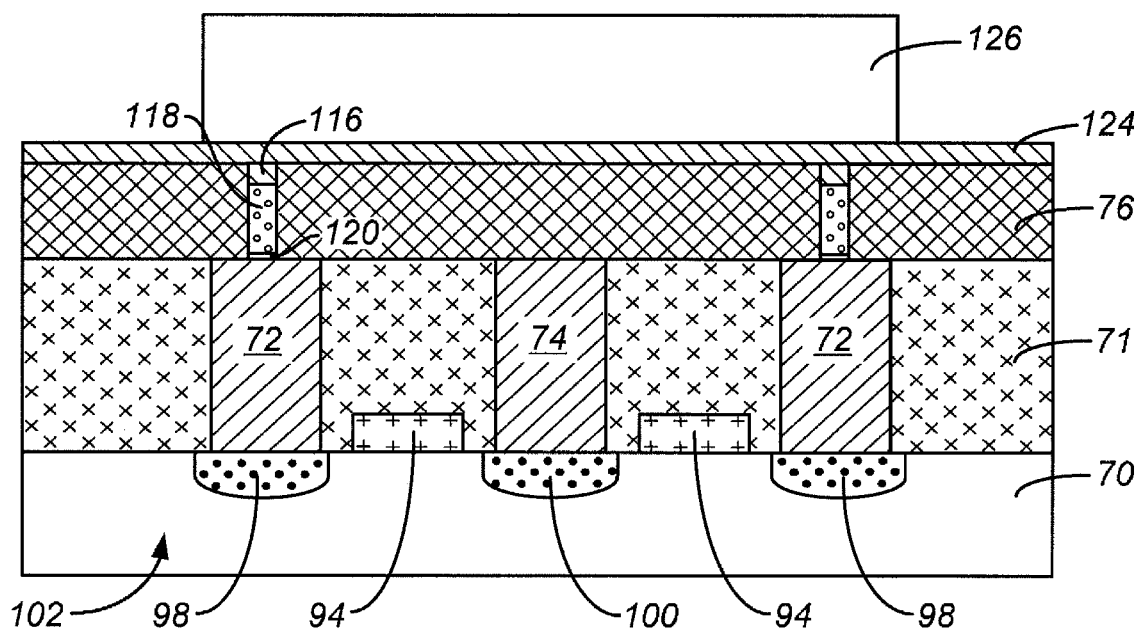

FIGS. 10 and 11 show the result of depositing a dielectric material on the structure of FIGS. 8 and 9 followed by a chemical mechanical polishing step to create a second subassembly 122 including first fill material layer 76. A top electrode material layer 124 is formed on second subassembly 122 forming the structure of FIG. 12. FIGS. 13 and 14 show the result of forming a second mask 126 on the top electrode material layer 124 of the structure of FIG. 12. Note, however, those portions of layer 124 not covered by a second mask 126 are removed in FIG. 14 for clarity of illustration. The end portions 127 of second mask 126 are trimmed to have a sublithographic lateral dimension perpendicular to direction 128. Second mask 126 extends in a second direction 128 so that second mask 126 crosses over memory assembly 114 above each bottom electrode 72. This crossover region 129 has sublithographic dimensions in both first and second directions 112, 128.

Figure 16:
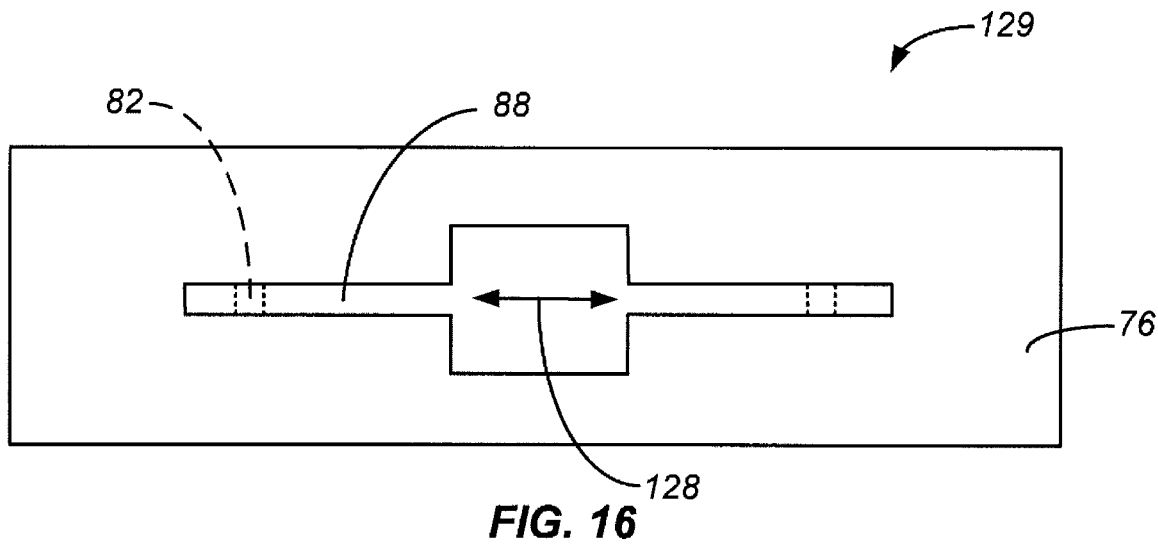
Figure 15:
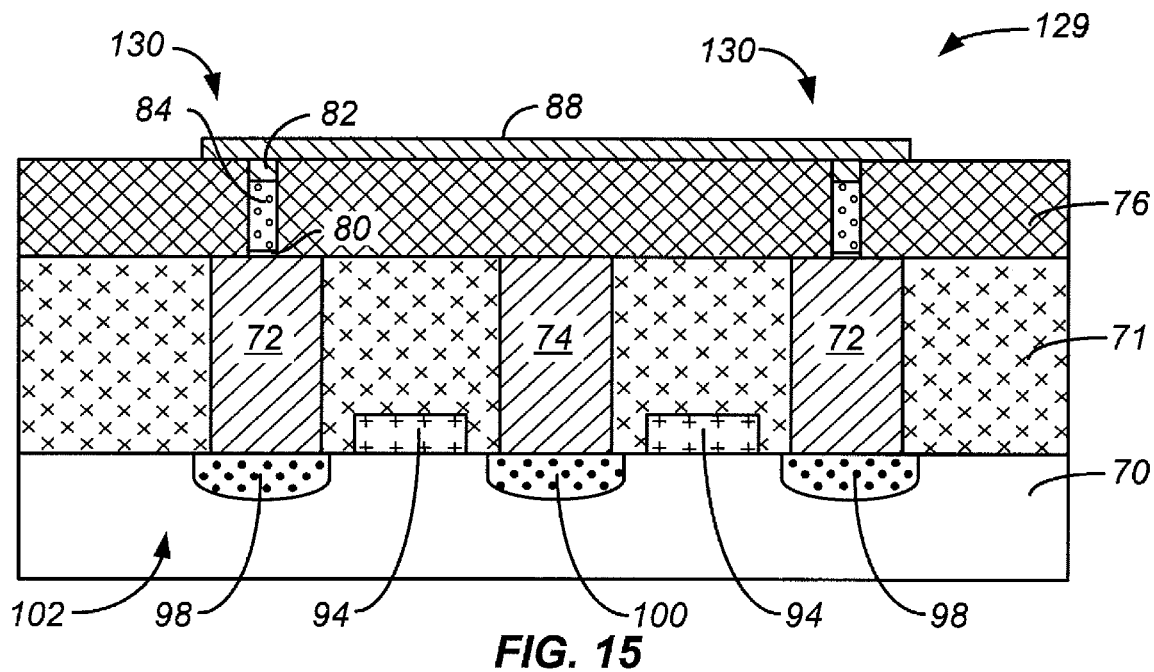
Figure 17:
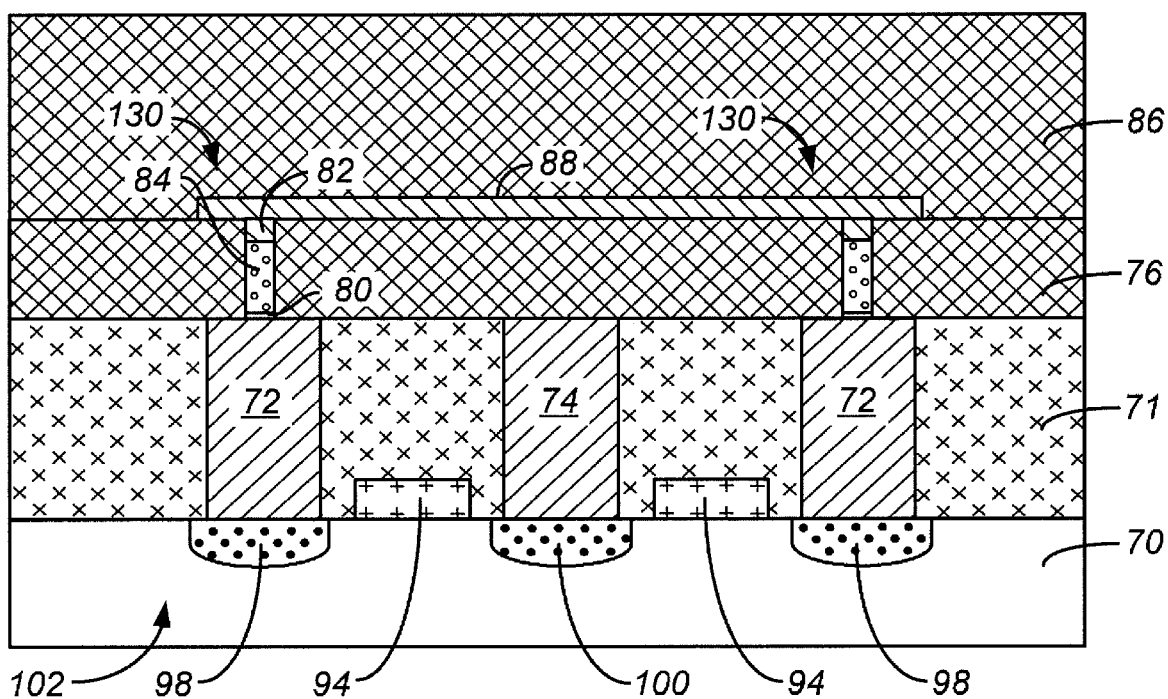
Figure 19:
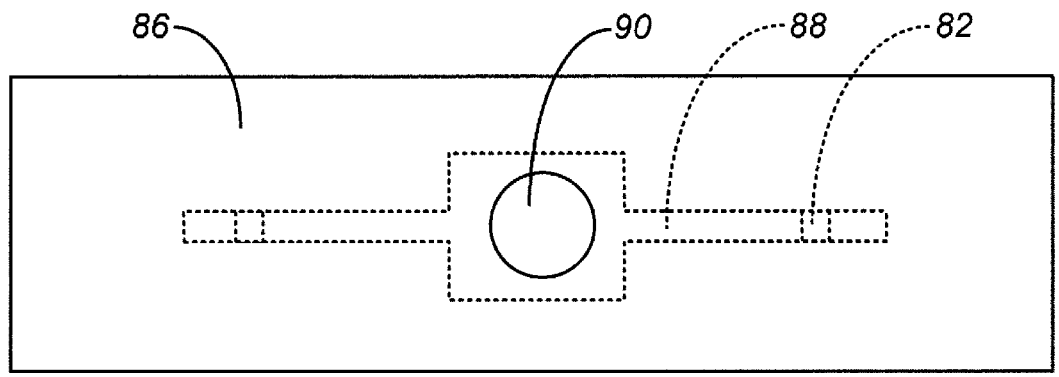
Figure 18:
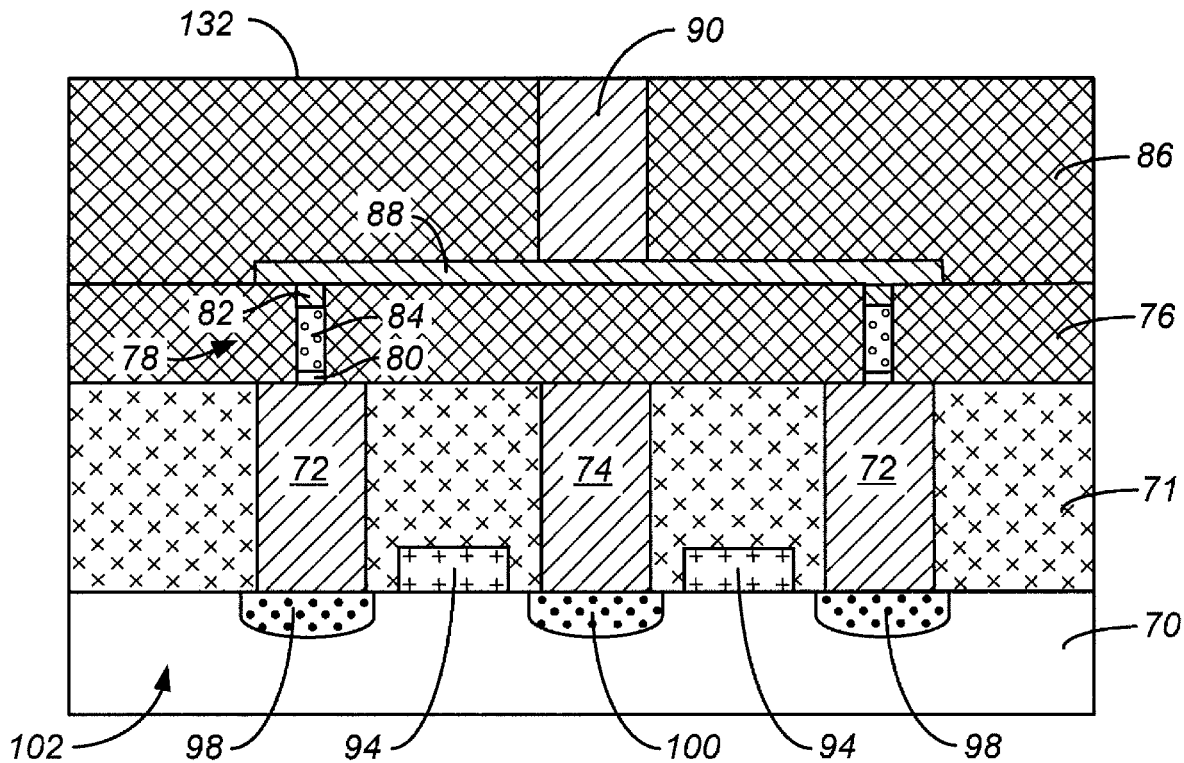

FIGS. 15 and 16 show the result of removing those portions of layer 124 and memory material portion 118 not covered by second mask 126 during an isolation etching step. This is followed by the removal of second mask 126 to create a third subassembly 129. Doing so creates a memory cell assembly 130 including top electrode 88, first electrode contact element 82, memory element 84 and electrode contact enhancement element 80. FIG. 17 shows second fill material layer 86 deposited on the structure of FIGS. 15 and 16. FIGS. 18 and 19 illustrate forming of the via 90 within layer 86 followed by, for example, a chemical mechanical polishing step to create an upper surface 132 on which an electrically conductive bit line 92, see FIG. 3, is formed.

One of the advantages of the invention over conventional techniques is that there is no need to open a via to connect to a pillar-type memory element or to try to connect a pillar-type of memory element to a line. The use of crossing line patterns, trimmed to sublithographic dimensions, creates a pillar-type memory element. The pillar-type memory element has sublithographic dimensions in two, typically perpendicular, directions. Line width control is generally better than hole diameter control using conventional lithographic techniques. This results in better memory element size control for the process. It also helps prevent potential damage to the memory element. The line pattern techniques used to create the pillar-type memory element are much easier to create and control than conventional techniques and result in much better dimension control.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A memory cell assembly comprising:
   first and second bottom contacts, each bottom contact comprising first and second ends;
   a top contact comprising first and second surfaces on opposite sides thereof;
   first and second memory assemblies each comprising a pillar-like memory element having a cross-sectional area and first and second dimensions measured in first and second transverse directions;
   the first and second memory elements positioned between and electrically connected to the first ends of the first and second bottom contacts, respectively, and to the second surface of the top contacts contact;
   the top contact having a first end region, overlying the first memory assembly, and a connecting region;
   an electrically conductive via having first and second ends, the second end of the via overlying and connected to the first surface of the top contact at the connecting region;
   the connecting region having a connecting region surface area and the second end of the via having a via surface area, the connecting region surface area being larger than the via surface area;
   the top contact extending in a first direction between the first and connecting regions;
   the top contact extending in a second direction perpendicular to the first direction;
   the size of the connecting region measured in the second direction being substantially greater than the size of the first end region measured in the second direction; and
   the first and second dimensions being smaller than a minimum feature size for a process used to form the memory element.

2. The assembly according to claim 1 further comprising a bottom contact enhancement element contacting the memory element and the bottom contact.

3. The assembly according to claim 2 wherein the bottom contact enhancement element has a cross-sectional area generally equal to the cross-sectional area of the memory element.

4. The assembly according to claim 1 further comprising a top contact enhancement element contacting the memory element and the top contact.

5. The assembly according to claim 4 wherein the top contact enhancement element has a cross-sectional area generally equal to the cross-sectional area of the memory element.

6. The assembly according to claim 1 wherein the electrically conductive via is in electrical contact with an electrically conductive line to create a memory device.

7. The assembly according to claim 6 wherein the electrically conductive line is a bit line.

8. The assembly according to claim 1 wherein the top contact has first and second end regions, overlying the first and second memory assemblies, respectively, with the connecting region therebetween.

9. The assembly according to claim 8 wherein the size of the connecting region measured in the second direction is substantially greater than the size of each of the first and second end regions measured in the second direction.

10. The assembly according to claim 9 wherein the second dimension is measured in the second direction, and the size of at least one of the first and second end regions measured in the second direction is substantially identical to the second dimension of the underlying pillar-like memory element.

11. The assembly according to claim 9 wherein the size of the connecting region measured in the second direction is greater than the size of the via surface area measured in the second direction.

12. The assembly according to claim 9 wherein the sizes of the connecting region measured in the first and second directions are greater than the sizes of the via surface area measured in the first and second directions, respectively.

13. The assembly according to claim 1 wherein the top contact overlies and is electrically connected to two of said memory assemblies.

14. A memory cell assembly comprising:
   first and second bottom contacts, each bottom contact comprising first and second ends;
   a top contact comprising first and second surfaces on opposite sides thereof;
   first and second memory assemblies each comprising a pillar-like memory element having a cross-sectional area and first and second dimensions measured in first and second transverse directions;
   the first and second memory elements positioned between and electrically connected to the first ends of the first and second bottom contacts, respectively, and to the second surface of the top contact;
   the top contact having first and second end regions, overlying the first and second memory assemblies respectively, and a connecting region therebetween;
   an electrically conductive via having first and second ends, the second end of the via contacting the first surface of the top contact at the connecting region;

the connecting region having a connecting region surface area and the second end of the via having a via surface area, the connecting region surface area being larger than the via surface area;

the top contact extending in a first direction between the first and second end regions;

the top contact extending in a second direction perpendicular to the first direction;

the size of the connecting region measured in the second direction being substantially greater than the size of each of the first and second end regions measured in the second direction;

the second dimension being measured in the second direction, the size of each of the first and second end regions measured in the second direction being substantially identical to the second dimension of the underlying pillar-like memory element;

the sizes of the connecting region measured in the first and second directions being greater than the sizes of the via surface area measured in the first and second directions, respectively; and the first and second dimensions being smaller than a minimum feature size for a process used to form the memory element.

* * * * *